(12) United States Patent
Zawalski et al.

(10) Patent No.: US 8,572,529 B2
(45) Date of Patent: Oct. 29, 2013

(54) SYSTEM AND METHOD FOR DYNAMICALLY INJECTING ERRORS TO A USER DESIGN

(75) Inventors: Gavin Zawalski, San Jose, CA (US); Mark Lewis, Glasgow (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/156,179

(22) Filed: Jun. 8, 2011

(65) Prior Publication Data

US 2012/0317533 A1 Dec. 13, 2012

(51) Int. Cl.
*G06F 17/50* (2006.01)
*G06F 11/22* (2006.01)
*G06F 9/455* (2006.01)
*G06F 11/00* (2006.01)
*G06G 7/62* (2006.01)

(52) U.S. Cl.
USPC ............... 716/106; 716/136; 703/13; 703/14; 714/37; 714/41

(58) Field of Classification Search
USPC ............ 716/106, 136; 703/13, 14; 714/37, 41
See application file for complete search history.

(56) References Cited

U.S. PATENT DOCUMENTS

| | | | |
|---|---|---|---|
| 6,182,248 B1 * | 1/2001 | Armstrong et al. | 714/43 |
| 7,320,114 B1 * | 1/2008 | Jain et al. | 716/106 |
| 2003/0093256 A1 * | 5/2003 | Cavanagh et al. | 703/14 |
| 2004/0034820 A1 * | 2/2004 | Soltis et al. | 714/47 |
| 2009/0313411 A1 * | 12/2009 | Stenfort | 710/306 |
| 2012/0023315 A1 * | 1/2012 | Colletti et al. | 712/227 |

OTHER PUBLICATIONS

Xgig® Jammer—SAS/SATA Error Injection to 6 Gb/s, Finisar Corporation, 2009, dated Mar. 2009.
LeCroy, SAS and SATA Protocol Solutions for Testing and Verification, Jul. 2005.

* cited by examiner

*Primary Examiner* — A. M. Thompson
(74) *Attorney, Agent, or Firm* — Dickstein Shapiro LLP

(57) ABSTRACT

A method and system for dynamically injecting errors to a user design is disclosed. In one embodiment, the user design having internal states and parameters is run in a design verification system. A reconfigurable design monitor monitors a plurality of error conditions based on the internal states and parameters of the user design and generates a trigger event when a predefined error condition is met. The reconfigurable design monitor transmits a trigger event to an error injector. The error injector injects dynamic errors associated with the triggering event to the user design via a control path to test the user design under the predefined error condition.

18 Claims, 7 Drawing Sheets

SYSTEM AND METHOD FOR DYNAMICALLY INJECTING ERRORS TO A USER DESIGN

FIELD

The field of the invention relates generally to hardware and software verification of logic circuits and more particularly relates to a method and system for dynamically injecting errors to a programmable user design.

BACKGROUND

During a design verification test, circuit design models are tested for verifying their functionality and functional behavior at error conditions as well as normal operation conditions. Typically, test vectors generated by testbenches, automatic test equipment (ATE), or actual target devices are fed to the circuit design implemented in a functional simulator, a hardware-based simulation accelerator, or a hardware emulator to capture erratic or unintended behavior violated by the circuit design during the design verification test. The erratic or unintended behavior observed during the verification test is carefully analyzed, and the circuit design is corrected if necessary and tested until it behaves as intended without identifiable errors.

Full functional verification of a circuit design requires testing under all possible conditions to ensure that all design paths are completely simulated and hence verified. Failure to test all design paths may result in a critical bug that is not discovered before the circuit design is finalized. Complex circuits typically require a very large number of tests to accomplish full functional verification, resulting in a very long verification test time. Additionally, the generation of large test suites is subject to errors or missed test conditions.

Functional circuit design verification must also include verification of the system and software interaction with the design, including responses to error conditions. This verifies correct detection and reporting of an error condition by the circuit and the system's correct responsiveness to the detected error condition.

The coverage by the verification test can be enhanced by including tests that are targeted to exercise specific paths within the circuit design. In some cases, knowledge of internal design states and parameters is needed to define test cases.

For testing error handling and recovery capability of a circuit design, errors are intentionally produced and injected to test the behavior of the circuit design under error conditions, preferably in real data traffic to define flag-specific events in the circuit design during the test.

Several approaches have been made to verify user designs in test cases. User designs can be verified in a pure simulation or hardware-based simulation acceleration environment, oftentimes in conjunction with a testbench that generates data streams and test cases. Alternatively, user designs can be modeled and run in an emulator, FPGAs, hardware prototyping system, or other systems as connected to a real target system generating real data streams. Error injectors are used to expand a number of test cases to which the circuit design is exposed by injecting errors into the circuit's input data streams during a design verification test. Test results are obtained and compared to the expected behavior.

In a simulation or simulation-acceleration environment, test data is generated by testbenches that model the functional behavior of other devices in a target environment. The characteristics of the modeled devices and the test data that they generate generally differ from those of actual target devices at some level. Therefore, simulation and simulation-acceleration cannot directly verify circuit design behavior under actual target conditions.

Additionally, tests in simulation or simulation acceleration are run orders of magnitude slower than normal operating speed. This limits their usability for system-level and driver-level software verification. Consequently, these environments cannot fully verify the interaction of circuit designs with software, including error detection, response, and recovery.

Error injectors running with emulators, rapid prototyping systems, or FPGAs also have limitations. The commercially available error injectors have no visibility of the internal conditions of the design itself. Therefore, they can only inject errors based only on external conditions of the design, such as protocol conditions or data conditions that are observable externally.

The present invention overcomes the above-identified shortcomings of prior art error injecting techniques and provides benefits and solutions by dynamically injecting errors to a user design based on internal design conditions for the purpose of testing error cases during a design verification test.

SUMMARY

A method and system for dynamically injecting errors to a user design is disclosed. In one embodiment, the user design having internal states and parameters is run in a functional design verification system. A reconfigurable design monitor monitors a plurality of error conditions based on the internal states and parameters of the user design and generates a trigger event when a predefined error condition is met. The reconfigurable design monitor transmits a trigger event to an error injector. The error injector injects dynamic errors associated with the triggering event to the user design via a control path to test the user design under the predefined error condition.

It is an objective of the present invention to provide means for verifying circuit design responses to specific error test cases while operating with realistic data traffic. Test conditions that correspond to target specific design paths inside the circuit design are specified through the use of internal design states and parameters. The test conditions provide an opportunity to verify system and software response to the error conditions. This approach is advantageous over prior art techniques such that targeted design path testing is performed with realistic data traffic.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

Figure 1:
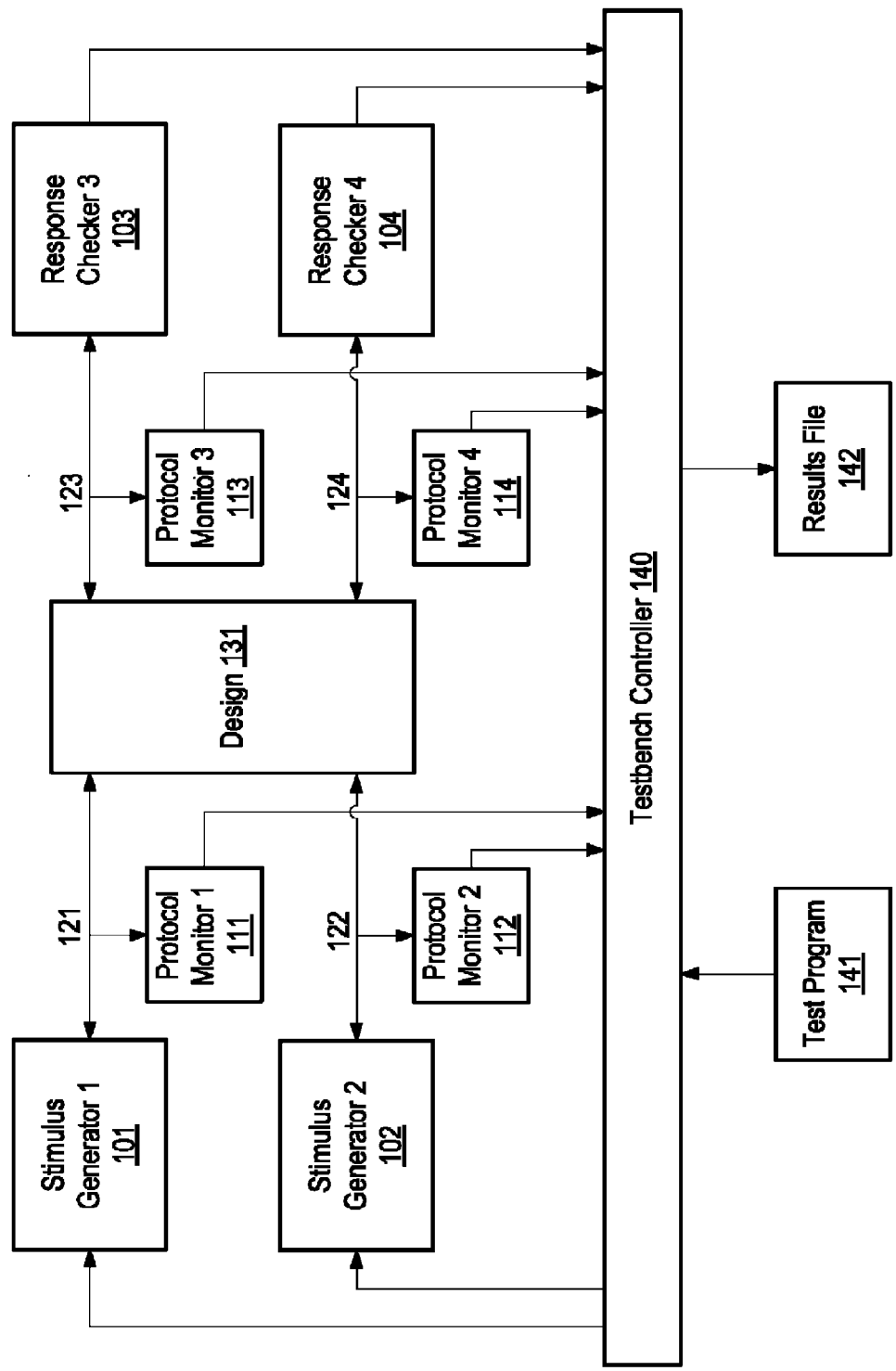
FIG. 1 illustrates an exemplary simulation environment with design verification capability, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for dynamically injecting errors to a user design is disclosed. In one embodiment, the user design having internal states and parameters is run in a functional design verification system. A reconfigurable design monitor monitors a plurality of error conditions based on the internal states and parameters of the user design and generates a trigger event when a predefined error condition is met. The reconfigurable design monitor transmits a trigger event to an error injector. The error injector injects dynamic errors associated with the triggering event to the user design via a control path to test the user design under the predefined error condition.

Each of the features and teachings disclosed herein can be utilized separately or in conjunction with other features and teachings to provide a method for reducing the order of system models exploiting scarcity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, design verification systems such as a hardware emulator, simulator, and hardware-accelerated simulator systems, or testers providing scan inputs to such design verification systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an exemplary simulation environment with functional design verification capability, according to one embodiment, that highlights typical techniques used in a simulator to verify a design. The user design 131 is implemented in a simulator, along with other components of the testbench, including stimulus generators 101 and 102, response checkers 103 and 104, protocol checkers 111, 112, 113 and 114, and test controller 140. The testbench exercises inputs of the circuit design and monitors outputs of the user design 131. Stimulus generators 101 and 102 generate protocol-specific test data to exercise user design 131 under specific test conditions in a software simulation environment. Response checkers 103 and 104 communicate with the user design 131 and capture output data. Protocol monitors 111, 112, 113, and 114 examine modeled protocol data 121 and 122, and response protocol data 123 and 124 against expected data and identify any violations of the protocols. Test program 141 defines test scenarios that control the behavior of the stimulus generators 101 and 102, and checks the responses captured by the response checkers 103 and 104. The testbench controller 140 provides overall control of the testbench components and generates the results file 142 that summarizes the behavior of the user design 131 during the test.

Simulation testbenches use several methodologies for defining and generating test suites to verify functions of a circuit design. For example, directed tests are used to test the circuit design against specific input data patterns, or to test specific internal circuits of the circuit design. These directed test cases are crafted to generate and apply test stimuli to verify the functional behavior of the circuit design with known input data streams. Conversely, constrained random tests generate test data with random stimuli based on a series of equations and random variables. Therefore, the test results provide a statistically quantifiable level of verification to the circuit design. Coverage driven tests expand on the constrained random test methodology by targeting areas of the circuit design that have not been fully exercised, thereby achieving a higher level of coverage across the circuit design. Testbenches can also be designed to model specific types of data stream conditions operating near or at the normal operating speed that the circuit design actually experiences in its targeted system environment. With this approach, functional verification focuses on the realistic operating conditions under which the circuit design actually operates.

Simulation testbenches have visibility into the internal states and parameters of the circuit design and can leverage this information when generating test suites. This enables the generation of targeted test suites that can increase the level of verification coverage without greatly increasing the number of verification tests. However, simulation testbenches are based on models of target devices, thus they do not fully represent the true behavior of actual target devices in a real system under a real operation environment. Incorrect or errant behavior in target devices may not be fully represented in the testbench. In addition, the generation of test cases relies on user inputs, thus it can be subject to errors or omissions. This may result in missed test cases and reduced verification.

Full verification of a circuit design requires testing at a system-level including various layers of software that interact with the circuit design. The circuit design must operate properly in a system environment under normal operating conditions, as well as under fault conditions. The circuit design must properly detect, report, and/or recover from fault conditions caused by the input data stream. In doing so, the circuit design interacts with system software.

The run-time performance of a typical simulation system is orders of magnitude slower than real systems. The slow run-time performance reduces the practicality of simulations as a tool for system-level and driver-level verification, and consequently for the verification of the circuit design interacting with software.

Figure 2:
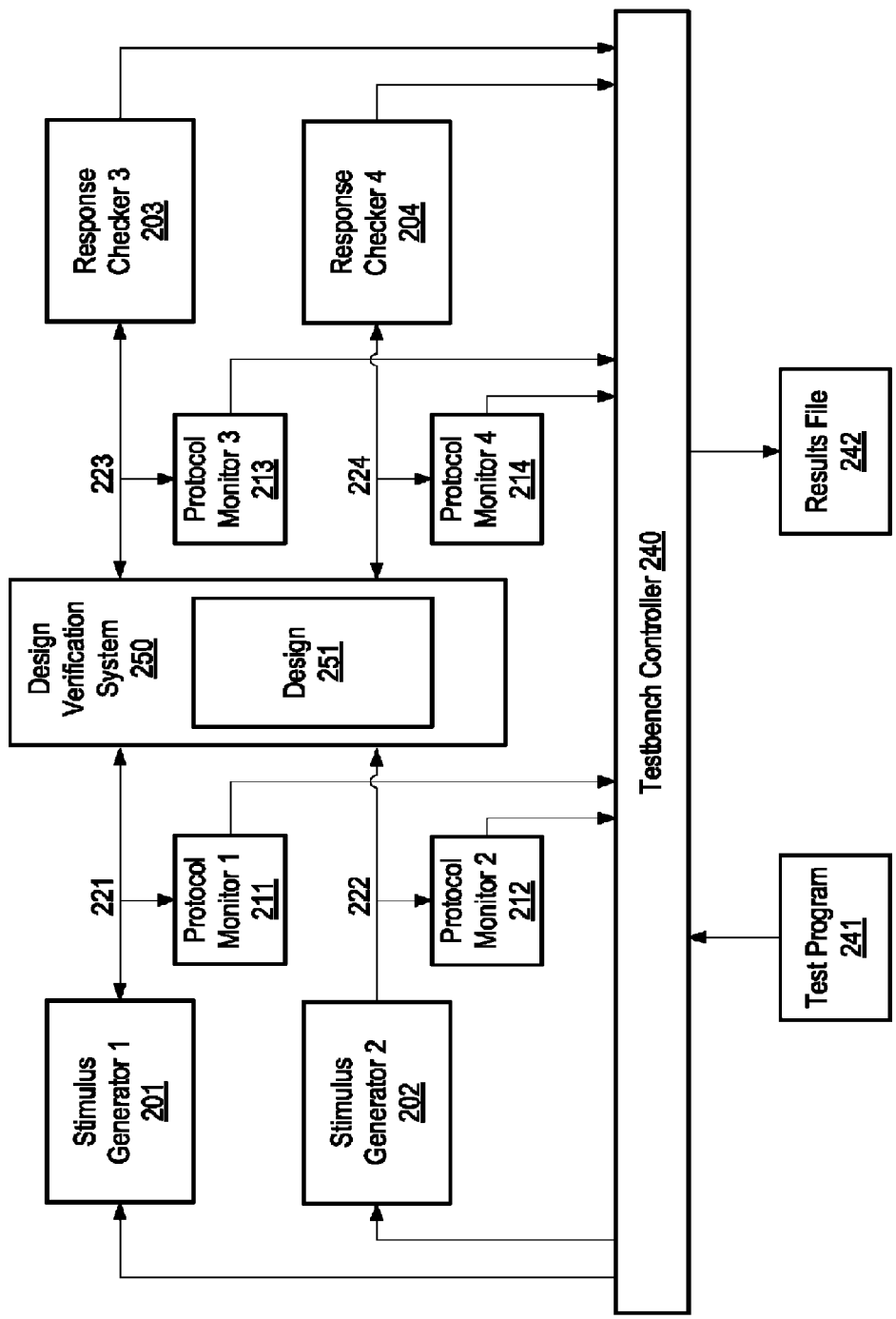
FIG. 2 illustrates an exemplary simulation-acceleration environment with design verification capability, according to one embodiment.

FIG. 2 illustrates an exemplary simulation-acceleration environment with design verification capability, according to one embodiment. Simulation-acceleration differs from pure simulation in that the user design is resident in a hardware accelerator instead of a simulator. In this example, design verification system 250 hosts the user design, and the testbench components 201-204, 211-214, 241, and 242 functions in a similar fashion as in the simulation system of FIG. 1. Simulation-acceleration provides similar functionality, and has similar limitations to pure simulation, but runs at a faster speed.

Figure 3:
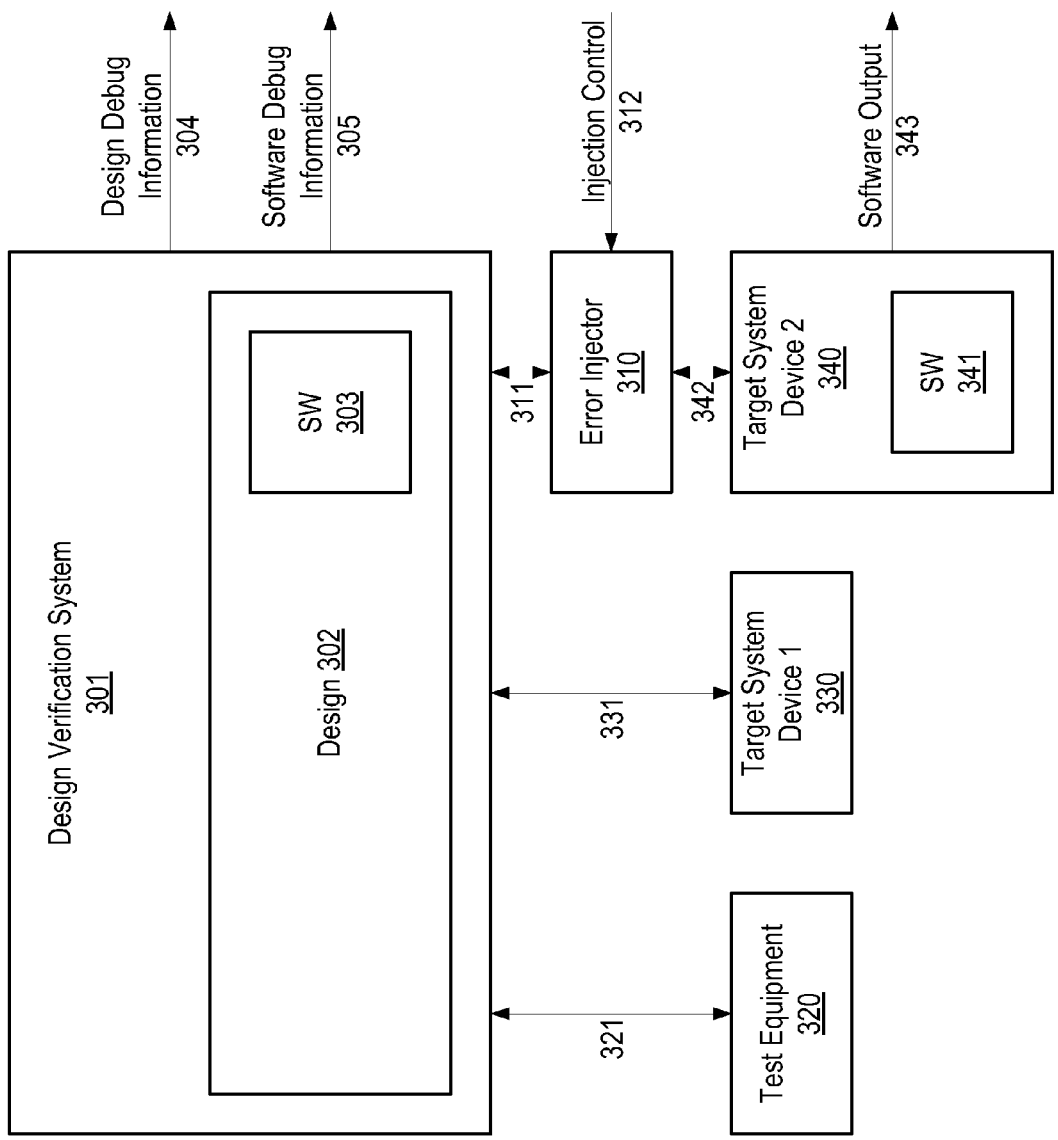
FIG. 3 illustrates an exemplary emulation or hardware-based verification system with static error injection capability, according to one embodiment.

FIG. 3 illustrates an exemplary emulation or hardware-based verification system with static error injection capability, according to one embodiment. User design 302 implemented in design verification system 301 is coupled to test equipment 320, target system device 330, and target device 340 through error injector 310. Test equipment 320 and target system devices 320 and 330 provide real target stimuli in the form of protocol data 311, 321 and 331 to user design 302. Stimuli from target device 340 are further enhanced through injection of error conditions by error injector 310. Protocol data 311 including error conditions provides additional verification of user design 302 by expanding the types of test patterns in a data stream between target system device 340 and user design 302. Error injector 310 has no visibility into user design 302, therefore provides only static error injection based on the conditions externally seen in protocol data 342. Specific paths in user design 302 can be targeted if the conditions for exercising the path can be derived from protocol data 342.

Figure 4:
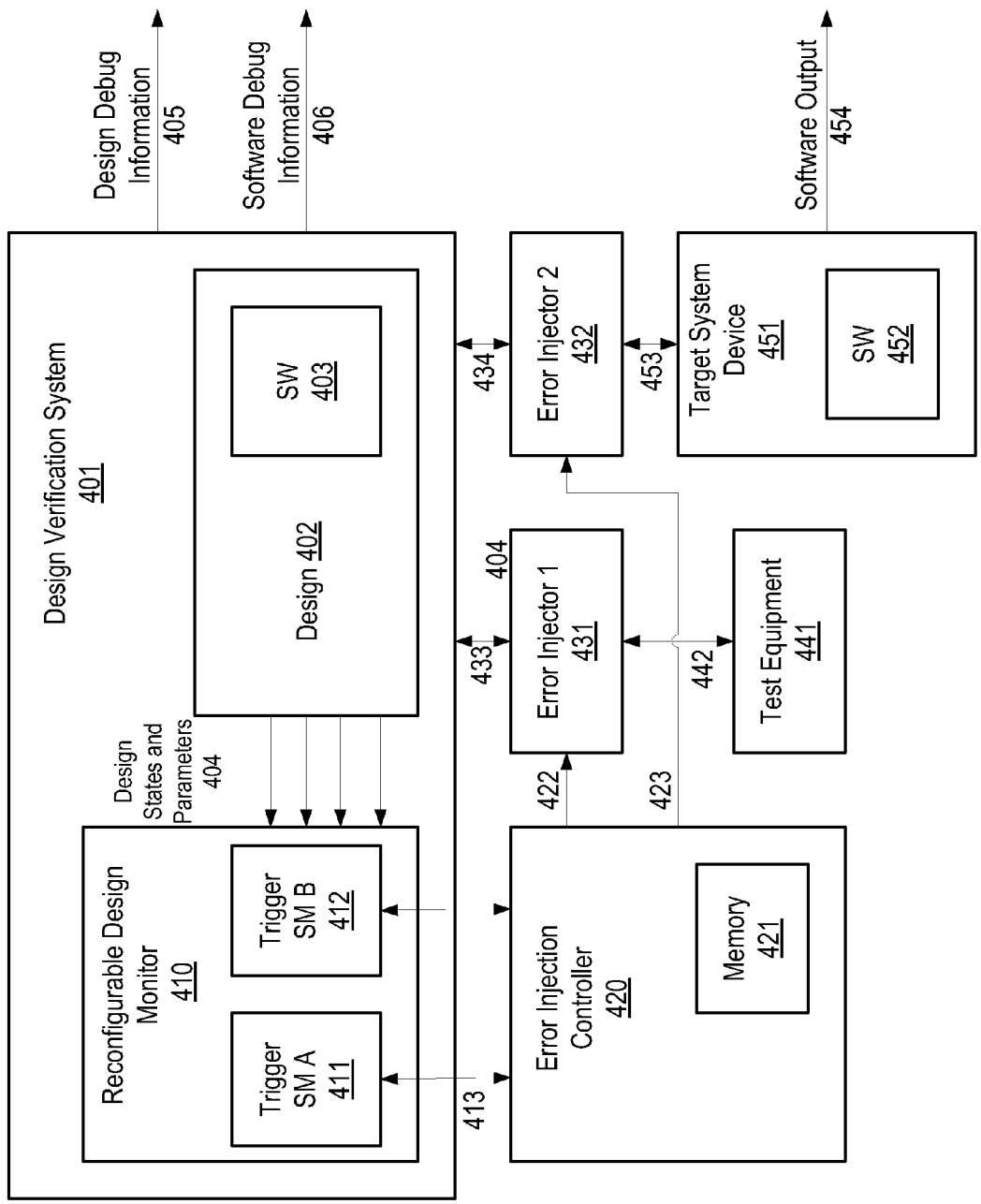
FIG. 4 illustrates a schematic of an exemplary design verification system with dynamic error injection capability, according to one embodiment.

FIG. 4 illustrates a schematic of an exemplary design verification system with dynamic error injection capability, according to one embodiment. In one embodiment, design verification system 401 implements a hardware prototype of user design 402 and emulates user design 402 in a hardware-based emulator. Emulation improves the speed and accuracy of design verification by substituting simulation test vectors with live stimuli from test equipment 441 or target device 451. During emulation, test equipment 441 and target system device 451 communicate with user design 402 and exchange protocol-specific data 433 and 434 in real-time or close-to real-time. Protocol conditions are expanded, for the purpose of testing, through injection of errors in the data streams 433 and 434 by error injectors 431 and 432. The expanded test conditions provide additional verification of user design 402, as well as verification of software response by embedded software 403 of user design 402 and software component 452 (e.g., driver of application) of target system device 451. Debug information 406 from embedded software 403 and software component 452 is monitored to verify correct response and recovery from the injected error conditions. Additionally, design debug information 405 such as waveforms, signal values, and state values, are provided by design verification system 401 for further characterization and analysis of the design during emulation.

In a conventional design verification test, internal states of a user design are not readily available to external devices, partly due to the limited bandwidth for communication with external periphery and partly due to the vast number of internal parameters. Small and fixed sets of parameters can be made available to the external devices such as test equipment 441 and target system device 451 through modification of user design 402 and the hardware prototype. This greatly limits the number and variety of targeted error conditions with existing static error injectors.

According to one embodiment, internal states (e.g., design states and parameters) of user design 402 are monitored by reconfigurable design monitor 410 in design verification system 401. Design monitor 410 contains a set of trigger state machines (e.g. 411, 412) each capable of producing a trigger event based on user-defined trigger conditions. At the start of the test, the user-defined trigger conditions are loaded into the trigger state machines. Each trigger condition defines a sequence of values that must be observed on particular design states and the state values prior to the error injection. During the verification test, design monitor 410 sends each trigger signal (e.g. 413, 414) to error injection controller 420 when a trigger condition of the corresponding trigger state machine (e.g. 411, 412) is met. Reconfigurable design monitor 410 may contain any number of trigger state machines, each with its own corresponding trigger signal. Error injection controller 420 receives the trigger events from design verification system 401 across dedicated trigger signals 413 and 414. The two trigger state machines 411 and 412 are consolidated into one state machine 411 as in FIG. 6. Note that the error injection capability can leverage multiple trigger conditions running on multiple state machines. Each trigger condition can activate a separate error condition, so that multiple error injection cases can be active simultaneously. However, for simplicity, the example only used one trigger condition. Controller 420 correlates the received trigger events with lists of predefined error commands stored within internal command memory 421. Each trigger signal can activate a separate sequence of error commands. Error injection controller 420 delivers the error commands in a sequential order to error injectors 431 and 432. Error injectors 431 and 432 inject errors into protocol data streams 442 and 453 when the protocol conditions for the defined errors are met, thereby injecting corrupted data streams 433 and 434, respectively. The corrupted protocol data 433 and 434 are applied to the inputs of user design 402, and the desired test condition is provided during the verification test.

For the purpose of synchronizing error injection with internally triggered conditions, a control path, consisting of reconfigurable design monitor 410 and trigger signal 413 and 414, is created between user design 402 and error injectors 431 and 432. When a specific error condition is triggered, errors are injected to user design 402 under test in design verification system 401. This integrated approach overcomes the limitations of prior art error injection techniques by expanding error injection capability based on both externally observable and internally triggered conditions of user design 402. This allows for enhanced control of injected errors, particularly when error injection needs to be triggered by an internal event while user design 302 is running a test.

The present technique for dynamic error injection enables users to define, configure, and control error injection precisely by providing access to internal parameters and conditions of a user design. It allows users to associate internal design states and parameters 404 of user design 402 to specific error conditions that are monitored by trigger state machine 411 of design monitor 410.

Figure 5A:
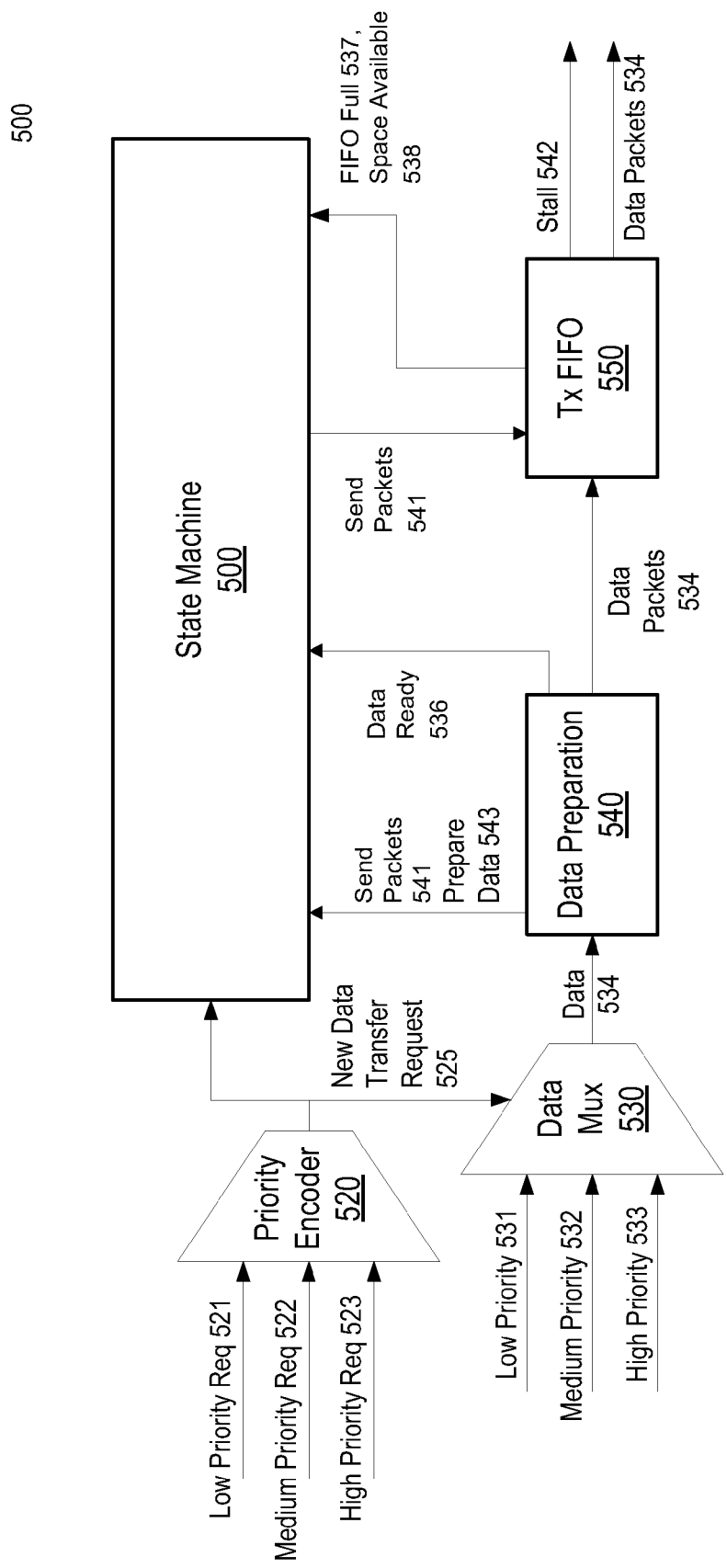
FIG. 5A represents exemplary internal components of a user design including a state machine with multiple design paths, according to one embodiment.

FIG. 5A represents exemplary internal components of a user design including a state machine with multiple design paths, according to one embodiment. Dynamic error injection is used to exercise specific paths within the user design for verification purposes. State machine 500 has multiple logical paths and controls the processing of data 534 and the transmission of data packets 534 across the interface using data preparation block 540 and transmission FIFO block 550.

Requests for data transfers come from multiple sources within the user's design, each with a different priority level. Priority encoder 520 receives low priority data transfer request 521, medium priority data transfer request 522, and high priority data transfer request 523, and selects the highest priority request 525 for transmission. Priority encoder 520 sends the new data transfer request 525 to state machine 500, indicating that a new transfer should be initiated. State machine 500 receives the request and, when able, starts a transfer by asserting signal prepare data 543 and subsequently asserting signal send packets 541. Once state machine 500 starts a packet transfer, the transfer continues until completion, even if priority encoder 520 receives a higher priority request and changes the value of new data transfer request 525. However, prior to state machine 500 starting a packet transfer (e.g. by asserting send packets 541), priority encoder 520 can change the value of data transfer request 525 to a higher priority request. State machine 500 will switch to the new value of data transfer request 525 as long as it is not in the process of sending packets from a previous data transfer request. Prior to starting a packet transfer, state machine 500 signals to data preparation block 540 to start retrieving data and preparing it for transfer. State machine 500 asserts signal prepare data 543 to start this process. Data preparation block 540 signals back to state machine 500 when sufficient data is available to start the transfer by asserting signal data ready 536. Upon detection of signal data ready 536, state machine 500 starts a packet transfer by asserting signal send packets 541. Data preparation block 540 sends data packets to Tx FIFO 550 for eventual transmission. Tx FIFO 550 buffers packets whenever stall signal 542 is asserted, and transmits packets otherwise. Stall requests original from the packet receiving device and are communicated to the transmitting device through mechanisms defined in the interface protocol specification. The stall request is translated into a stall signal by additional logic in the user design. Multiple assertions of stall signal 542, or assertion of stall signal 542 for a long duration, may cause the FIFO to become full. Tx FIFO 550 signals this status to state machine 500 by asserting signal FIFO full 537. State machine 537 will pause the sending of packets by deasserting signal send packets 541 until Tx FIFO signals that buffer space is available (e.g. by asserting space available 538). Upon completion of the packet transfer, state machine 500 will deassert send packets 541 and return to its idle state.

Figure 5B:
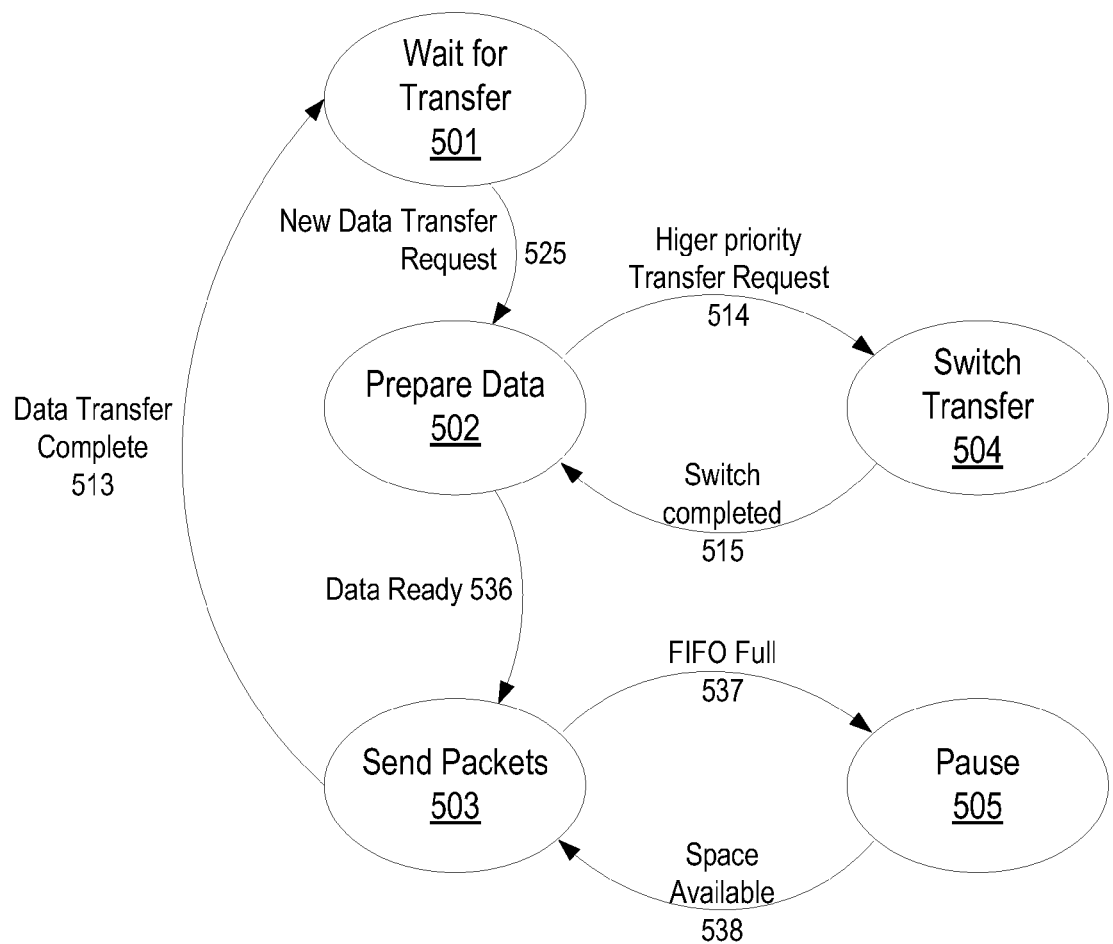
FIG. 5B illustrates an exemplary schematic work flow of the state machine of FIG. 5A, according to one embodiment.

FIG. 5B illustrates an exemplary schematic work flow of state machine 500 in FIG. 5A, according to one embodiment. Verification tests are intended to exercise various logic paths in this state machine. Under normal operating conditions, some paths are frequently exercised whereas other paths are exercised more rarely. A normal data transfer operation that does not trigger a FIFO full condition 537 causes the state machine to transition from WAIT FOR TRANSFER state 501 to PREPARE DATA state 502, to SEND PACKETS state 503, and then back to WAIT FOR TRANSFER state 501. Test cases that handle sparse packet transfer exercise the normal path 501-503. If the packet transfer rate is increased, state machine 500 may experience FIFO full conditions while sending packets (e.g. in the SEND PACKETS 503 state). This would cause a transition to the PAUSE 505 state.

Test cases that generate a FIFO full condition 537 lead to a deviation from the normal path 501-503. FIFO full condition 537 may occur when transferring high data rates and/or receiving transmit pause requests (sometimes referred to as "applying backpressure") from a data packet receiving device. Pausing of the transmit path (i.e., backpressure) can be achieved by injecting negative acknowledgement (NAK)

symbols, or other protocol-specific flow control, into the data stream. FIFO full condition 537 occurs during active transmission of packets, and state machine 500 generally experiences this condition while in SEND PACKETS state 503. State machine 500 responds to the condition by transitioning to PAUSE state 505. Once the FIFO has sufficiently emptied, state machine 500 transitions back to SEND PACKETS state 505.

The transition path from PREPARE DATA state 502 to SWITCH TRANSFER state 504 occurs less commonly than the transition path from SEND PACKETS state 503 to PAUSE state 505. The transition from 502 to 504 occurs if state machine 500 receives a data transfer request, transitions to the PREPARE DATA state 502, and subsequently receives a higher priority data transfer request while preparing data packet 534 but the transmission of data packet 534 has not yet started. In practice, data transfer requests 521-523 rarely occur simultaneously or within a short period of time from each other. In normal operating conditions, state machine 500 stays only briefly in PREPARE DATA state 502 before transitioning to SEND PACKETS state 503. Under these conditions, the transition from PREPARE DATA state 502 to SWITCH TRANSFER state 504 occurs rarely in normal operating conditions. It is therefore difficult to craft test cases based on external data that specifically targets this rarely occurring design path 502 to 504. However, internal design states and parameters, FIFO status, and pending data transfer requests can be used together to create test cases to specifically target and exercise this path.

According to one embodiment, a test case for dynamic error injection is specifically targeted to generate a FIFO full condition 537 at the end of a data transfer. A FIFO full condition 537 can be created by injecting a NAK symbol into the user design's receive stream corresponding to the last data packet or packets in a data transfer. The FIFO full condition 537 can be maintained while the user design transitions to WAIT FOR TRANSFER state 501, and eventually PREPARE DATA state 502, through the injection of additional NAKs. The user design remains in PREPARE DATA state 502 as long as the FIFO full condition 537 persists, and the user design is artificially held in this state until a higher priority request is received. This test case exercises the targeted path from 502 to 504 in the user design.

Figure 6:
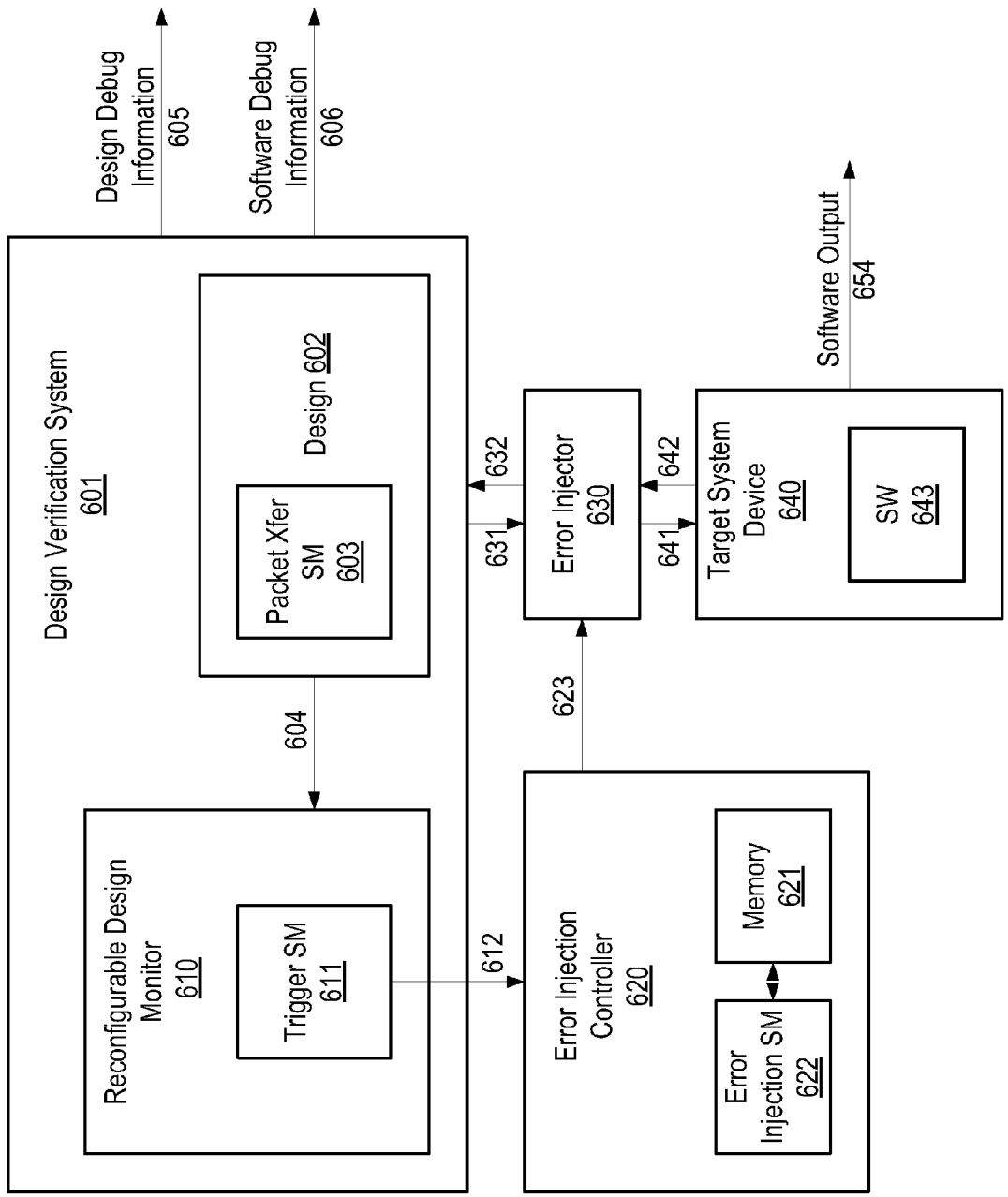
FIG. 6 illustrates an example of the dynamic error injection process for a specific verification test case, according to one embodiment.

FIG. 6 illustrates an example of the dynamic error injection process for a specific verification test case, according to one embodiment. In this example, user design 602's internal states and parameters 604 (e.g., packet transfer state, last packet in a transfer flag, low priority request flag, and high priority request pending flag) are visible to reconfigurable design monitor 610 and its internal trigger state machine 611. Design monitor 610 embodies the internal debug capabilities of design verification system 601, providing signal and state monitoring and triggering capability. Design monitor 610 exposes a configuration interface to the user in the form of a graphical user interface, command line interface, scripting interface, or the equivalent, that can be used to define the criteria for generating trigger conditions. The trigger criteria consists of a sequence of values that must be seen on user design 602's internal states and parameters 604 before asserting the trigger signal. Reconfigurable design monitor 610 is configured with the user-defined error injection test case specification including the definition of logical trigger sequences to be used by trigger state machine 611. These sequences specify a plurality of trigger events, for example, when the packet transfer state is in SEND PACKETS state 503, the last packet in transfer is asserted, the low priority request is asserted, and the high priority request pending indicates a high priority request is forthcoming. Trigger state machine 611 monitors user design 602 during a test, and generates one or more trigger events when the user-specified trigger conditions are met. The trigger events are passed to error injection controller 620 using trigger signal 612 to generate an error injection command 623. For example, the error injection command 623 instructs error injector 630 to replace ACK symbols generated by target device 640 with NAK symbols. Error injector controller 620 passes the error injection command 623 to error injector 630 across a control path. Error injector 630 waits for the next occurrences of ACK symbols in the data stream and replaces them with NAKs. This condition is maintained until the packet transfer state transitions to SWITCH TRANSFER state 504.

A method and system for dynamically injecting errors to a user design is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method, comprising:
running a user design in a design verification system, the user design having internal states and parameters;
monitoring a plurality of predefined error conditions based on the internal states and parameters of the user design;
generating a trigger event when a first error condition of the plurality of predefined error conditions is met;
injecting dynamic errors associated with the triggering event; and
running a test of the user design under the first error condition using the dynamic errors injected to the user design,
wherein the internal states and parameters comprise a packet transfer state and a data transfer request in the user design.

2. The computer-implemented method of claim 1, wherein the design verification system is selected from among a group consisting of a hardware-based emulator, a hardware-based prototyping system, and an FPGA-based design implementation system.

3. The computer-implemented method of claim 1, wherein the dynamic errors contain information of the internal states and parameters of the user design.

4. The computer-implemented method of claim 1, wherein the trigger event is sent to an error injection controller and the dynamic errors are stored in a memory of the error injection controller.

5. The computer-implemented method of claim 1, wherein the first error condition switches the data transfer request during a FIFO full condition.

6. The computer-implemented method of claim 1, wherein the packet transfer state is used to insert a negative acknowledgement (NAK) symbol in a data frame to the user design when a low priority request is available and a high priority request is forthcoming.

7. A non-transitory computer-readable medium having stored thereon a plurality of instructions, said plurality of instructions when executed by a computer, cause said computer to perform:
running a user design in a design verification system, the user design having internal states and parameters;
monitoring a plurality of predefined error conditions based on the internal states and parameters of the user design;

generating a trigger event when a first error condition of the plurality of predefined error conditions is met;
injecting dynamic errors associated with the triggering event; and
running a test of the user design under the first error condition using the dynamic errors injected to the user design,
wherein the internal states and parameters comprise a packet transfer state and a data transfer request in the user design.

8. The non-transitory computer-readable medium of claim 7, wherein the design verification system is selected from among a group consisting of a hardware-based emulator, a hardware-based prototyping system, and an FPGA-based design implementation system.

9. The non-transitory computer-readable medium of claim 7, wherein the dynamic errors contain information of the internal states and parameters of the user design.

10. The non-transitory computer-readable medium of claim 7, wherein the trigger event is sent to an error injection controller and the dynamic errors are stored in a memory of the error injection controller.

11. The non-transitory computer-readable medium of claim 7, wherein the first error condition switches the data transfer request during a FIFO full condition.

12. The non-transitory computer-readable medium of claim 7, wherein the packet transfer state is used to insert a negative acknowledgement (NAK) symbol in a data frame to the user design when a low priority request is available and a high priority request is forthcoming.

13. An integrated error injection system for injecting errors into a user design, comprising:
a design verification system;
a user design adapted to be run in the design verification system, the user design having internal states and parameters;
a reconfigurable design monitor monitoring a plurality of predefined error conditions based on the internal states and parameters of the user design and generating a trigger event when a first error condition of the plurality of predefined error conditions is met;
an error injector coupled to the design verification system; and
a control path between the design verification system and the error injector, wherein a trigger event is transmitted to the error injector via the control path, and wherein the error injector injects dynamic errors associated with the triggering event to the user design to test the user design under the first error condition,
wherein the internal states and parameters comprise a packet transfer state and a data transfer request in the user design.

14. The integrated error injection system of claim 13, wherein the design verification system is selected from among a group consisting of a hardware-based emulator, a hardware-based prototyping system, and an FPGA-based design implementation system.

15. The integrated error injection system of claim 13, wherein the dynamic errors contain information of the internal states and parameters of the user design.

16. The integrated error injection system of claim 13, wherein the trigger event is sent to an error injection controller and the dynamic errors are stored in a memory of the error injection controller.

17. The integrated error injection system of claim 13, wherein the first error condition switches the data transfer request during a FIFO full condition.

18. The integrated error injection system of claim 13, wherein the packet transfer state is used to insert a negative acknowledgement (NAK) symbol in a data frame to the user design when a low priority request is available and a high priority request is forthcoming.

* * * * *